United States Patent [19]

Kubo et al.

[11] Patent Number: 4,751,475

[45] Date of Patent: Jun. 14, 1988

[54] LOCAL OSCILLATION APPARATUS

[75] Inventors: Kazuhiko Kubo, Osaka; Akira Usui, Takatsuki; Hiroyuki Nagai, Ibaraki, all of Japan

[73] Assignee: Matsushita Electric Industrial Co., Ltd., Kadoma, Japan

[21] Appl. No.: 46,916

[22] PCT Filed: Jul. 14, 1986

[86] PCT No.: PCT/JP86/00358

§ 371 Date: Mar. 20, 1987

§ 102(e) Date: Mar. 20, 1987

[87] PCT Pub. No.: WO87/00706

PCT Pub. Date: Jan. 29, 1987

[30] Foreign Application Priority Data

Jul. 22, 1985 [JP] Japan ................ 60-161396

[51] Int. Cl.⁴ .......... H03B 5/04; H03B 5/18; H03L 1/02

[52] U.S. Cl. ................ 331/117 D; 331/176; 331/177 V

[58] Field of Search ........... 331/8, 10, 66, 96, 101, 331/107 C, 108 C, 108 D, 117 D, 167, 176, 177 V, 102; 333/223

[56] References Cited

U.S. PATENT DOCUMENTS 4,228,539 10/1980 Hamalainen ............ 331/117 D X
4,504,801 3/1985 Stut ...................... 331/101 X

FOREIGN PATENT DOCUMENTS 48-54850 8/1973 Japan.

OTHER PUBLICATIONS

National Technical Report, vol. 31, No. 2, Apr. 1985 (Osaka), Miyake, Hideyuki et al, "Ido Tsushinkiyo Microwave Yudentai Device", P115-123 especially, see p. 122, left column.

Primary Examiner—Eugene R. Laroche
Assistant Examiner—David Mis
Attorney, Agent, or Firm—Cushman, Darby & Cushman

[57] ABSTRACT

The present invention relates to a local oscillation apparatus which is used as a local oscillator of a communication apparatus or as a fixed local oscillator of a tuner. The present invention comprises a coaxial resonator (1) and an amplifying circuit (26) having an output end connected to a central conductive member of the coaxial resonator (1) through a first capacitor (2), an input end connected to the central conductive member through a second capacitor (3), and a variable capacitance diode (5) having one end connected to the central conductive member of the coaxial resonator (1) through a third capacitor (4) and the other end grounded so as to permit an alternating current only to be flowed. The circuit is characterized by such a constitution that an oscillation frequency is varied by a voltage applied to the variable capacitance diode (5), a cause of temperature drift of an oscillation frequency can be almost eliminated, and a stable oscillation can be accomplished by only compensation of the temperature characteristics of the coaxial resonator (1).

7 Claims, 5 Drawing Sheets

LOCAL OSCILLATION APPARATUS

TECHNICAL FIELD

The present invention relates to a local oscillation apparatus which is usable as a local oscillator of a communication apparatus and as a fixed local oscillator of a tuner of a double-super system.

BACKGROUND ART

Recently, systems using frequencies in a band of 800–1000 MHz have begun to be largely used in mobile communication such as with automobile telephones as a local oscillator for the communication apparatus. These frequencies have also been used for CATV of a television as a fixed local oscillator of a tuner of a double-super system suitable for multi-channel receiving, and utilization of a coaxial resonator using a dielectric ceramic is also being considered for such frequencies.

In the prior art, there is an apparatus which is elucidated, for example, in "National Technical Report," Vol. 31, No. 2, April, 1985. Hereinafter, referring to the figures, this local oscillation apparatus of the prior art will be elucidated.

FIG. 1 shows a local oscillation apparatus using the coaxial resonator of the prior art. Referring to FIG. 1, numeral 41 designates the coaxial resonator using dielectric ceramics, numeral 42 designates a coupling capacitor between the coaxial resonator 41 and an oscillation circuit, numeral 43 designates a coupling capacitor between the coaxial resonator 41 and a variable capacitance diode 44, numeral 44 designates the variable capacitance diode for varying oscillating frequency, numeral 45 designates a transistor for oscillation, numerals 46, 47 and 49 designate capacitors for feedback, numeral 48 designates a capacitor for grounding the base of the transistor 45, numeral 50 designates a bypass capacitor, numerals 51–54 designate resistors for supplying a power source and for giving a bias to the oscillating transistor 45, and numeral 55 designates a resistor for applying a voltage to the variable capacitance diode 44.

As to the local oscillation apparatus which is composed as mentioned above, the operation is elucidated hereafter.

The prior art oscillator has a constitution of a Clapp oscillation circuit of grounded base type. The coaxial resonator 41 is a coaxial resonator of the λ/4 type, and the inductive property (L component) in the vicinity of a resonance point is utilized. FIG. 2 shows a basic circuit of the Clapp oscillation circuit type, and its oscillation frequency is shown as follows.

$$f_0 = \frac{1}{2\pi \sqrt{LC_0}} \quad (1)$$

Where, $C_0 = \frac{C_1 C_2 C_3}{C_1 C_2 + C_2 C_3 + C_1 C_3}$.

Further, the variable capacitance diode 44 is connected in parallel to the coaxial resonator 41. By a control voltage applied to a terminal A, a capacitance of the variable capacitance diode 44 is varied, and the resonance frequency of the coaxial resonator 41 is equivalently varied. The oscillation output signal is taken out of a terminal B.

However, in the constitution mentioned above, as shown in the equation (1), as elements for deciding an oscillation frequency, there are utilized the capacitors 42, 46, 47 and 49 of FIG. 1. Capacitances of these capacitors are approximately 4 pF–5 pF, and a variation of oscillation frequency due to a temperature change is greatly influenced by temperature characteristics of these capacitors. That is to say, the coaxial resonator 41 output changes by about 10 ppm/°C. and has an almost linear variation, but as to the whole oscillation circuit including the above-mentioned capacitors, as shown in FIG. 3, it shows a curve with a width W of several hundred KHz. Therefore, even if temperature compensation is accomplished, a frequency error corresponding to the width arises yet, and there is problem that contriving a complete temperature compensation is difficult. Furthermore, since the circuit is made with the above-mentioned plural capacitors, there is a problem that making the oscillator as an integrated circuit is difficult.

DISCLOSURE OF INVENTION

The present invention, in view of the above-mentioned problems, has an object to provide a local oscillation apparatus wherein making it as an integrated circuit is easy and the influence of temperature drift can be reduced.

The local oscillation apparatus in the present invention is characterized by a coaxial resonator, an amplifying circuit with an output terminal connected to a central conductive member of the above-mentioned coaxial resonator through a first capacitor and an input terminal connected to the above-mentioned central conductive member through a second capacitor, and a variable capacitance diode wherein one end is connected to the central conductive member of the coaxial resonator through a third capacitor and another end is grounded with regard to alternating current, the oscillation frequency being varied by a voltage to be applied to the variable capacitance diode.

In accordance with the present invention, since a feedback type oscillator can be formed under very loose coupling between the input and the output terminals of the amplifying circuit by the coaxial resonator, cause of the temperature drift of the oscillation frequency in the amplifier can be almost eliminated, temperature change can be suppressed only by compensation of the temperature characteristics of the coaxial resonator, and a stable oscillation frequency is obtainable.

Figure 4:
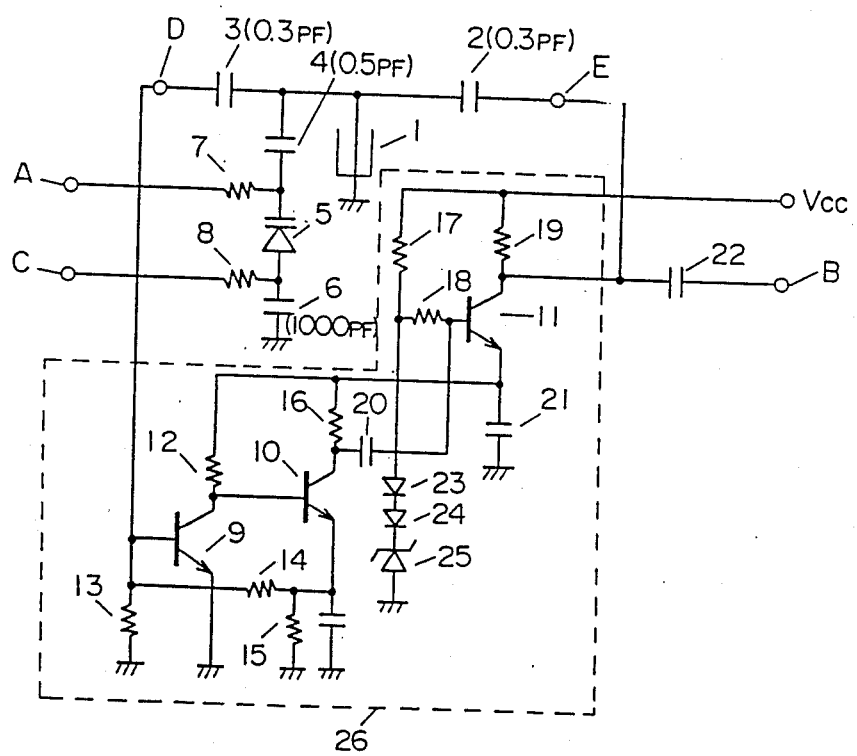
FIG. 4 shows the circuitry of a local oscillation apparatus in an embodiment of the present invention.
Figure 5:
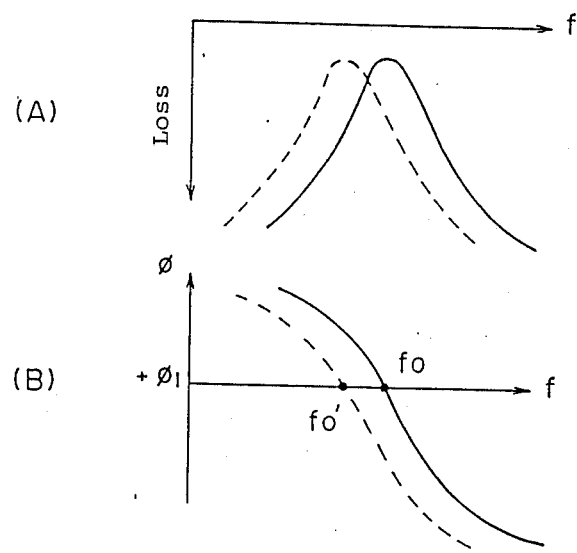
Figure 6:
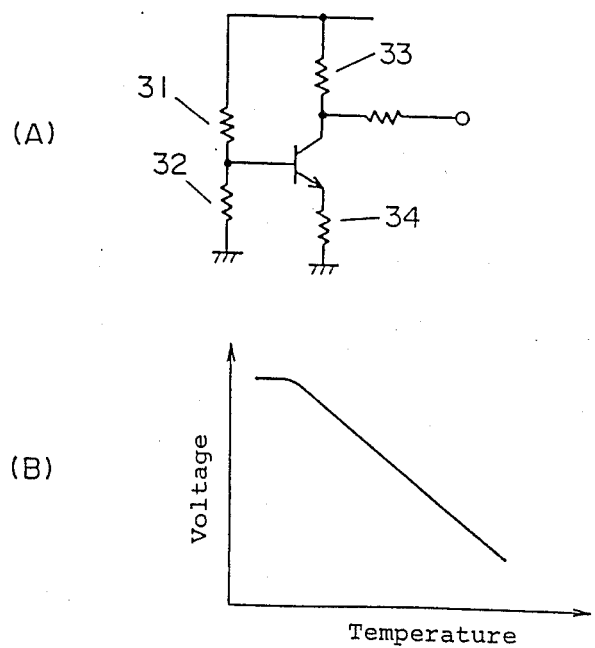
Figure 7:
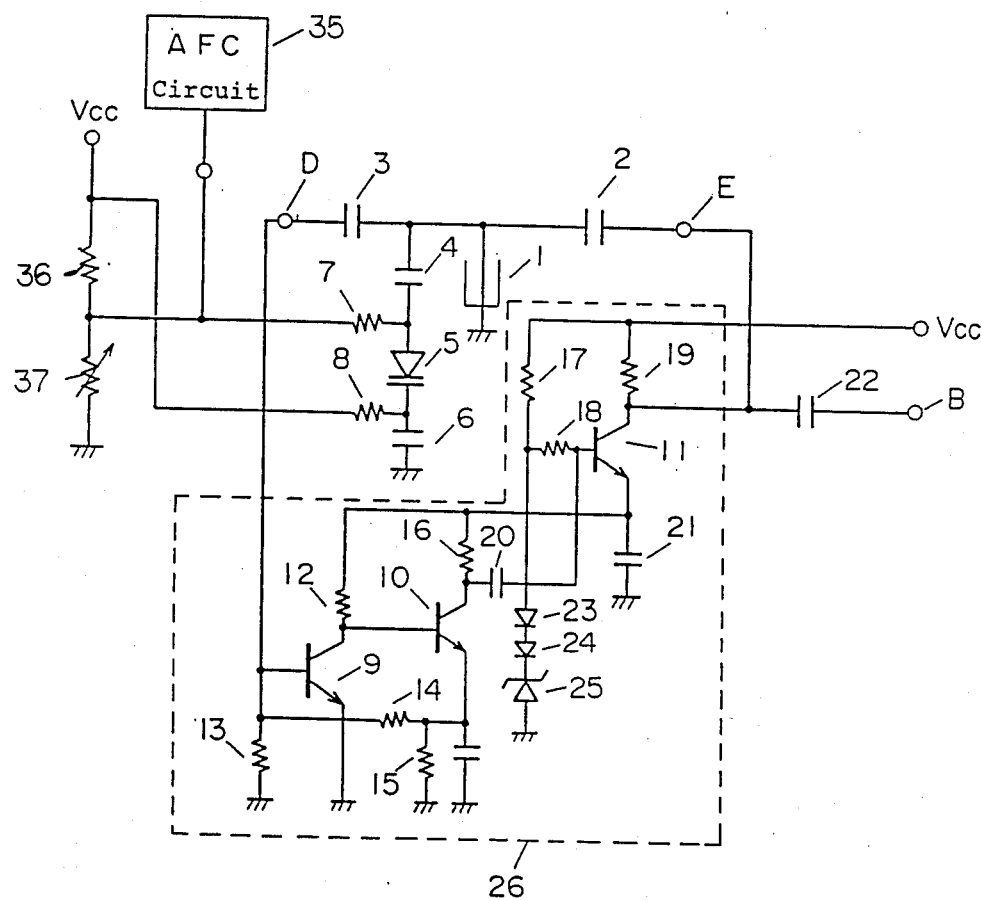
Figure 8:
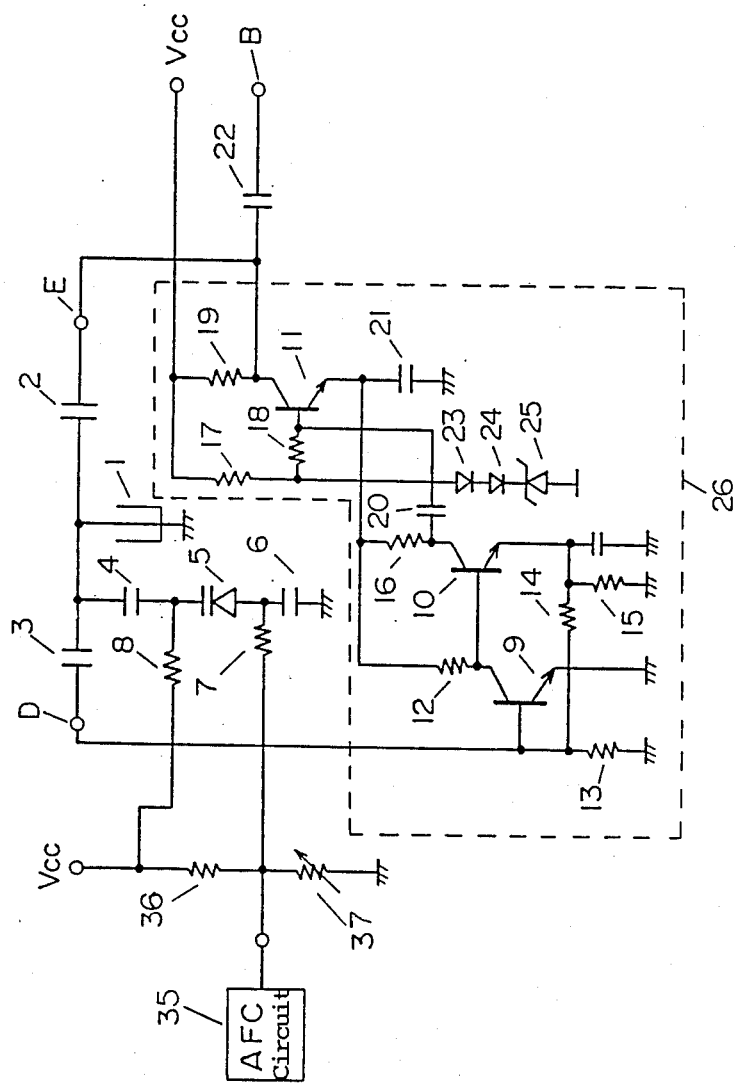

A and B of FIG. 5 are figures of the pass characteristics of the coaxial resonator in FIG. 4;

FIG. 6(A) shows the circuitry of a temperature compensation circuit which is usable in the circuit of FIG. 4;

FIG. 6(B) is a graph of the temperature characteristics of the circuit of FIG. 6(A), and FIG. 7 and FIG. 8 are circuitries of a local oscillation apparatus in other embodiments of the present invention.

BEST MODE FOR CARRYING OUT THE INVENTION

Hereinafter, an embodiment of the present invention is elucidated with reference to the drawings. FIG. 4 shows a local oscillation apparatus in an embodiment of the present invention.

In FIG. 4, numeral 1 designates a dielectric coaxial resonator, and numerals 2 and 3 designate capacitors utilizing an interval between conductive foils of a substrate, i.e., small capacitors such as 0.3–1 pF, and having respective terminals thereof connected to a central conductive member of the coaxial resonator 1. Numeral 4 designates a coupling capacitor which is connected to a variable capacitance diode 5 and is used for alleviating capacitance variation. Numeral 5 designates the variable capacitance diode for varying frequency; numeral 6 designates a DC stop capacitor; numerals 7 and 8 designate resistors for applying dielectric current voltage applied across terminals A and C across both the terminals of the variable capacitance diode 5; numerals 9, 10 and 11 designate amplifying transistors; numerals 12, 16 and 19 designate load resistors; numerals 13, 14, 15, 17 and 18 designate bias resistors; numeral 20 designates a coupling capacitor; numeral 21 designates a bypass capacitor; and numeral 22 designates a coupling capacitor for output to terminal B. Numeral 26 designates a three stage amplifier which accomplishes emitter grounded type amplifying of three stages, and it can be made into an integrated circuit. The above-mentioned capacitor 3 is connected to the base of the transistor 9 for amplifying via terminal D, and the capacitor 2 is connected to the collector of the amplifying transistor 11 via terminal E.

As to the oscillation apparatus which is constituted as mentioned above, the operation is elucidated hereafter. Referring to FIG. 4, the constitution of the circuit can be considered by taking points D and E as borders. At first, an amplifier 26 side is seen from the points D and E. The point D is connected to the base of the transistor 9 for a first stage amplifier, and the point E is connected the collector of the transistor 11 for the third stage amplifier. The amplifier 26 has three stage constitution of an emitter grounded type, and a wide range amplifier having a gain of 25-30 dB.

On the other hand, pass characteristics for the coaxial resonator side seen from the points D and E is shown in FIG. 5. Referring to FIG. 5, A shows an amplitude characteristic, and B shows a phase characteristic. Since the coaxial resonator 1 is connected to the amplifier 26 by the small capacitance capacitors 2 and 3 as shown in FIG. 4, though there is a loss of about 10 dB, its load Q becomes high, and oscillation of high purity is obtained. The oscillator oscillates at such a frequency that a phase sum of the coaxial resonator side and the amplifier side with the border points D and E becomes zero. That is to say, when a phase of the amplifier side is $-\phi 1$, as shown in FIG. 5B, it oscillates at a frequency $f_0$ where the phase of the coaxial resonator side becomes $+\phi 1$. Furthermore, in case the capacitance of the variable capacitance diode 5 which is connected to the coaxial resonator 1 in parallel is changed as shown in FIG. 5 by a dotted line, frequency $f_0$ changes, and similarly it oscillates at a frequency $f_0'$ where the phase becomes $+\phi 1$.

On the other hand, as to the temperature characteristics, when the coaxial resonator itself rises in temperature, the resonance frequency rises, and the change is a linear change of about 10–20 ppm/°C. This is so because the capacitors 2, 3 and 4 are very small in capacitance, such as 0.3–0.5 pF as mentioned above, and even if these capacitances are summed up, its temperature characteristics show a linear change. As a means for compensating this, for example, there is a method of compensation by connecting a capacitor utilizing an alumina substrate in parallel to the coaxial resonator. Further, and alternatively, there is a method of utilizing a temperature change of the base-emitter voltage $V_{BE}$ of the transistor amplifier as shown in FIG. 6(A). In case the output is issued from the collector of this transistor amplifier, the change of output voltage corresponding to the temperature becomes as shown in FIG. 6(B).

In FIG. 6(A), a temperature which makes the voltage change can be set by resistors 31 and 32, and a voltage variation corresponding to a temperature can be adjusted by the resistors 33 and 34. When the compensation voltage is applied to the terminal A in FIG. 4 and a voltage for adjusting oscillation frequency is applied to a terminal C, accompanying a temperature rise, a voltage applied across both terminals of the variable capacitance diode 5 is reduced, and a capacitance increases, and thereby it acts to reduce oscillation frequency. Thus a frequency variation corresponding to a temperature of the resonator itself can be compensated.

As mentioned above, in accordance with the constitution of FIG. 4, by connection of the dielectric coaxial resonator 1 which is very loosely coupled across the input and the output terminals of the amplifier 26, influence of variation of a non-linear oscillation frequency corresponding to a temperature of the amplifier side can be eliminated; therefore, temperature compensation also is sufficient to compensate a linear change of the coaxial resonator 1 so that temperature compensation is easily enabled. In accordance with the constitution of FIG. 4, the frequency change is suppressed within about 100 KHz.

Figure 1:
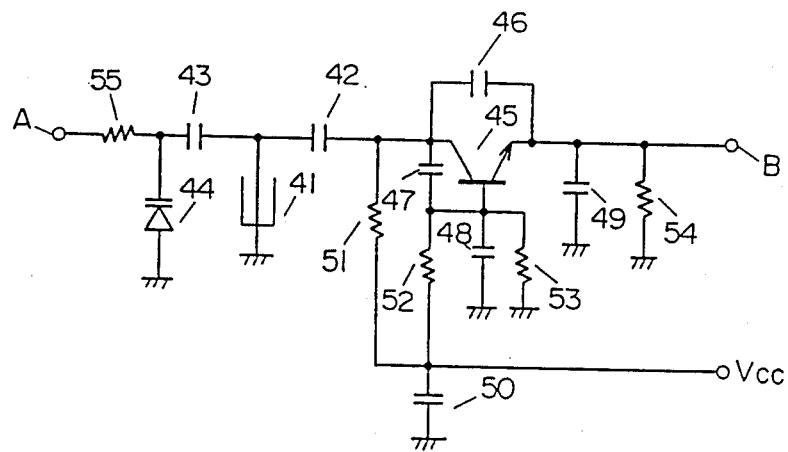
FIG. 1 shows the circuitry of the conventional oscillator.
Figure 2:
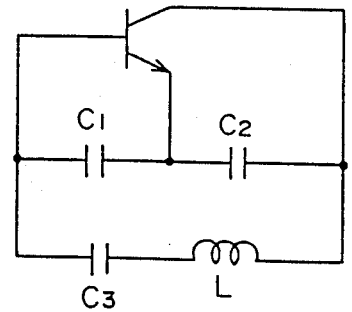
FIG. 2 shows the basic circuitry of the conventional oscillator.
Figure 3:
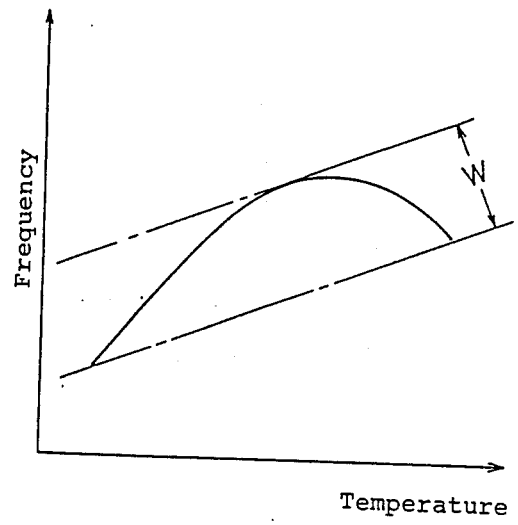
FIG. 3 is the graph of frequency-temperature characteristics of the conventional oscillator.

Furthermore, though a driver is required, in the case of the Clapp type oscillator of FIG. 1, since an output of only about −5 dBm is obtained, an output of 0 dBm can be obtained in the present constitution. Further, since both the three stage amplifier 26 and the circuit for generating temperature compensation voltage as shown in FIG. 6(A) can be mounted in an integrated circuit, the circuit can be simplified. Also, since the load of the coaxial resonator is loosely coupled, Q of the coaxial resonator becomes high, and an oscillator of higher purity is obtained, thereby improving the CN ratio of the oscillation carrier.

In FIG. 7, another embodiment of the present invention is shown. This embodiment utilizes an automatic frequency control AFC circuit 35 for temperature compensation, and adjustment of the oscillation frequency is operated by using a resistor 36, which is inserted in series between the +Vcc terminal of the power supply and ground, and a variable resistor 37. The variable capacitance diode 5 is grounded with regard to alternating current by the cathode through the capacitor 6, and its anode is connected to the coaxial resonator 1 through the capacitor 4. The +Vcc voltage is supplied to the cathode of the variable capacitance diode 5 through the resistor 8, and a direct current voltage which is determined by the variable resistor 37 and resistor 36 and the output of the AFC circuit 35 are supplied to the anode. A similar action and effect as the embodiment of FIG. 4 can be obtained by this constitution.

A further embodiment of the present invention is shown in FIG. 8. Referring to FIG. 8, a direct current voltage which is decided by the resistor 36 and variable resistor 37 and an output voltage of the AFC circuit 35 are applied to the anode of the variable capacitance diode 5 for oscillation frequency adjustment and temperature compensation, and the Vcc voltage is supplied to the cathode through the resistor 8 as in the embodiment of FIG. 7. In FIG. 8, however, a polarity of the variable capacitance diode 5 is changed from that of FIG. 7, so that the anode is connected to ground through the capacitor 6. In this constitution, a similar effect to the example of FIG. 4 is obtainable.

As mentioned above, according to the present invention, temperature compensation can be easily accomplished by a constitution wherein a loosely coupled coaxial resonator is connected across input and output terminals of an amplifier, and further, making the circuit as an integrated circuit is also easy, stable oscillation can be obtained, and it is usable as a tuner of a double-super system or a fixed local oscillator of a converter for CATV.

We claim:

1. A local oscillation apparatus provided with a coaxial resonator as an oscillation frequency deciding element, comprising:
    an amplifying circuit having an output terminal connected to a central conductive member of said coaxial resonator through a first capacitor and an input terminal connected to said central conductive member through a second capacitor, and
    a variable capacitance diode having one end of said diode connected to the central conductive member of said coaxial resonator through a third capacitor and another end of said diode grounded with regard to an alternating current, wherein the oscillation frequency is varied by a voltage applied to said variable capacitance diode.

2. A local oscillation apparatus in accordance with claim 1, characterized in that said first and second capacitors are constituted by utilizing a capacitance between conductive foils on a circuit substrate.

3. A local oscillation apparatus in accordance with claim 1, characterized in that said amplifying circuit is constituted by an amplifier of the emitter grounded type having a three stage serial connection.

4. A local oscillation apparatus in accordance with claim 1, characterized in that a voltage for adjusting the oscillation frequency is applied to one end of the variable capacitance diode, and a voltage for temperature compensation is applied to the other end of said variable capacitance diode.

5. A local oscillation apparatus in accordance with claim 1, characterized in that the variable capacitance diode is grounded with regard to the alternating current, a constant voltage is applied to the cathode of said diode, and the voltage for frequency adjustment and an output voltage of an automatic frequency control circuit are applied to the anode of said diode.

6. A local oscillation apparatus in accordance with claim 1, characterized in that the variable capacitance diode has its anode grounded with regard to the alternating current, the voltage for frequency adjustment and the output voltage of an automatic frequency control circuit are applied to said anode, and a constant voltage is applied to the cathode of said diode.

7. A local oscillation apparatus in accordance with claim 1, characterized in that the amplifying circuit is composed by an integrated circuit.

* * * * *